US010566998B2

United States Patent
Shintomi

(10) Patent No.: US 10,566,998 B2
(45) Date of Patent: *Feb. 18, 2020

(54) DATA CONVERSION APPARATUS

(71) Applicant: Murata Manufacturing Co., Ltd., Kyoto (JP)

(72) Inventor: Yuji Shintomi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/944,923

(22) Filed: Apr. 4, 2018

(65) Prior Publication Data

US 2018/0294821 A1  Oct. 11, 2018

(30) Foreign Application Priority Data

Apr. 6, 2017  (JP) .................. 2017-075986

(51) Int. Cl.
*G06F 11/00* (2006.01)
*H03M 13/00* (2006.01)
*H03M 13/09* (2006.01)
*H04L 1/00* (2006.01)

(52) U.S. Cl.
CPC ........ *H03M 13/098* (2013.01); *H04L 1/0045* (2013.01); *H04L 1/0061* (2013.01); *H04L 1/0063* (2013.01)

(58) Field of Classification Search
CPC combination set(s) only.
See application file for complete search history.

(56) References Cited

U.S. PATENT DOCUMENTS

2006/0236206 A1* 10/2006 Otsuka ................ G06F 11/1032
714/763
2018/0359055 A1* 12/2018 Shintomi .............. H04L 1/0063

* cited by examiner

*Primary Examiner* — Guerrier Merant
(74) *Attorney, Agent, or Firm* — Pearne & Gordon LLP

(57) ABSTRACT

A first parity calculator calculates one parity bit for serial binary data to be subjected to a conversion process. A second parity calculator calculates one parity bit for serial binary data obtained as a result of the conversion process. When both parity bits do not match, a multiplexer outputs, as a parity bit of the serial binary data obtained as a result of the conversion process, a parity bit obtained by inverting one parity bit included in the serial binary data to be subjected to the conversion process.

9 Claims, 2 Drawing Sheets

DATA CONVERSION APPARATUS

This application claims priority from Japanese Patent Application No. 2017-075986 filed on Apr. 6, 2017. The content of this application is incorporated herein by reference in its entirety.

BACKGROUND

The present disclosure relates to a data conversion apparatus. To meet a request for high-rate data transfer and low power consumption, serial communication becomes a mainstream of master-slave communication in the front-ends of cellular phones. In such serial communication, for example, as illustrated in FIG. 2, a data conversion apparatus 80 is used to relay communication between a master device 70 and slave devices 90. The data conversion apparatus 80 converts bit values of serial binary data SDATA1 to be transmitted from the master device 70 to the slave devices 90 to obtain serial binary data SDATA2 and transmits the serial binary data SDATA2 to any of the slave devices 90, namely, a slave device 90-1, 90-2, ..., or 90-N. The serial binary data SDATA1 includes an address that specifies the slave devices 90. The data conversion apparatus 80 converts the address that specifies the slave devices 90 to an address that specifies any of the slave devices 90-1, 90-2, ..., and 90-N in accordance with a predetermined conversion rule. Here, N is an integer greater than or equal to 1. The address conversion described above enables the master device 70 to pretend to communicate with a pseudo single slave device 90 without necessarily being aware of the plurality of slave devices 90-1, 90-2, ..., and 90-N.

In the communication between the master device 70 and the data conversion apparatus 80, any bit value of the serial binary data SDATA1 may have an error. Such an error can be detected as a parity error by using a parity bit that is added to the serial binary data SDATA1.

The data conversion apparatus 80 in the related art again calculates a parity bit from the serial binary data SDATA2 and adds the calculated parity bit to the serial binary data SDATA2. Thus, even though any bit value of the serial binary data SDATA1 is erroneous, the parity bit to be added to the serial binary data SDATA2 is re-calculated such that the value of the parity bit does not reflect the erroneous bit value of the serial binary data SDATA1. For example, in odd parity, the parity bit to be added to the serial binary data SDATA2 is calculated such that the value of the parity bit indicates that the number of is is odd although the number of 1s is actually even because of an erroneous bit of the serial binary data SDATA1. Odd parity means that the parity bit is calculated so that the number of is in serial binary data including the parity bit is odd.

BRIEF SUMMARY

Accordingly, the present disclosure provides a data conversion apparatus that performs a conversion process on serial binary data such that an erroneous bit value of the serial binary data to be subjected to the conversion process can be reflected in a parity bit of serial binary data obtained as a result of the conversion process.

According to embodiments of the present disclosure, a data conversion apparatus includes (i) a converter that performs a conversion process on one or more bit values of serial binary data including one parity bit in accordance with a predetermined conversion rule, the conversion process including inverting or non-inverting each of the one or more bit values of the serial binary data or converting each of the one or more bit values of the serial binary data into 0 or 1, (ii) a first parity calculator that calculates one first parity bit for the serial binary data to be subjected to the conversion process, and (iii) a second parity calculator that calculates one second parity bit for serial binary data obtained as a result of the conversion process. When the first parity bit and the second parity bit match, the converter outputs, as a parity bit of the serial binary data obtained as a result of the conversion process, a parity bit obtained by non-inverting the one parity bit included in the serial binary data to be subjected to the conversion process. When the first parity bit and the second parity bit do not match, the converter outputs, as a parity bit of the serial binary data obtained as a result of the conversion process, a parity bit obtained by inverting the one parity bit included in the serial binary data to be subjected to the conversion process.

A data conversion apparatus according to embodiments of the present disclosure may be capable of performing a conversion process on serial binary data such that an erroneous bit value of the serial binary data to be subjected to the conversion process is reflected in a parity bit of serial binary data obtained as a result of the conversion process.

Other features, elements, characteristics and advantages of the present disclosure will become more apparent from the following detailed description of embodiments of the present disclosure with reference to the attached drawings.

DETAILED DESCRIPTION

An embodiment of the present disclosure will be described with reference to the drawings. The same or substantially the same circuit elements are given the same numerals and are not described again.

Figure 1:
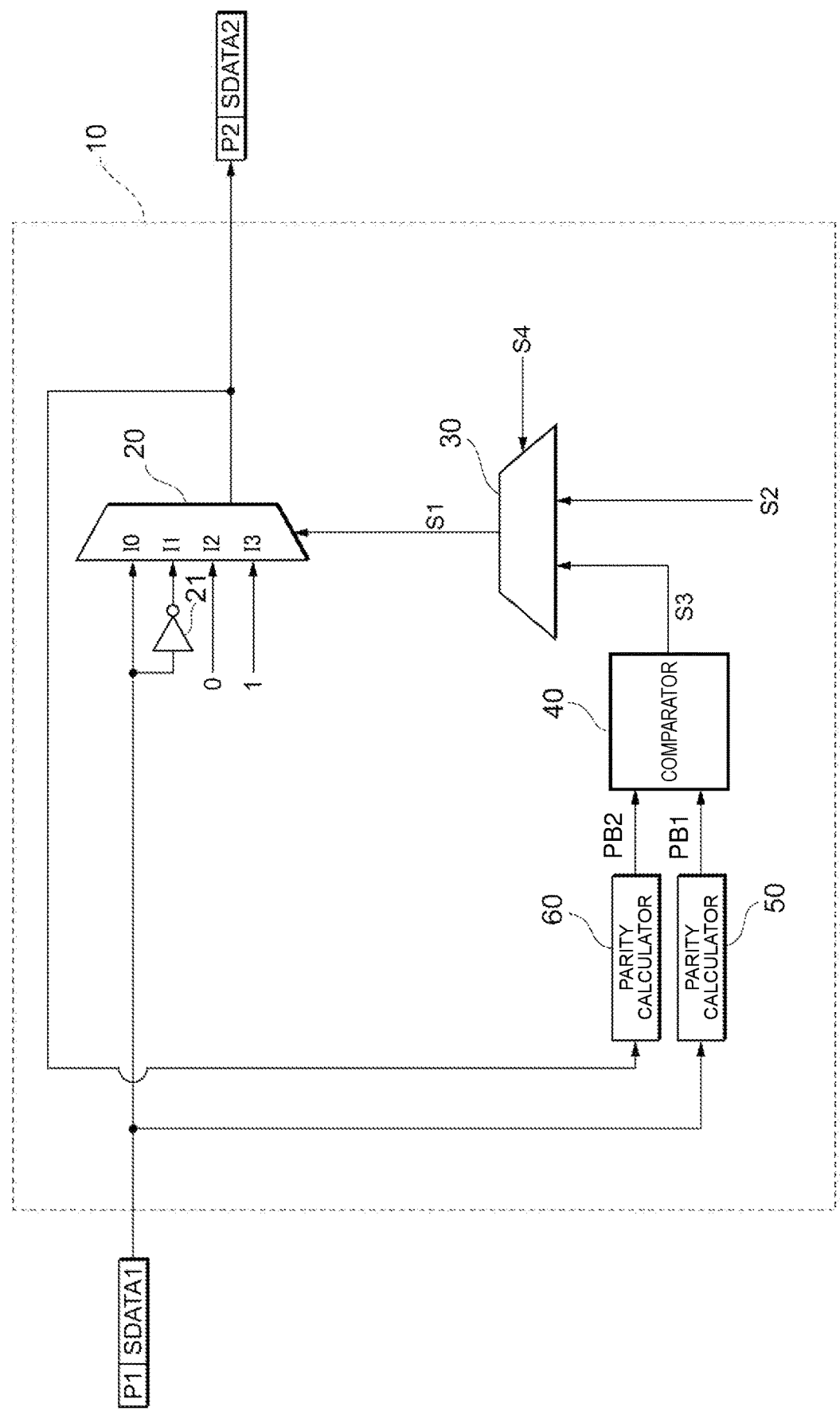
FIG. 1 is a circuit diagram of a data conversion apparatus according to an embodiment of the present disclosure.
Figure 2:
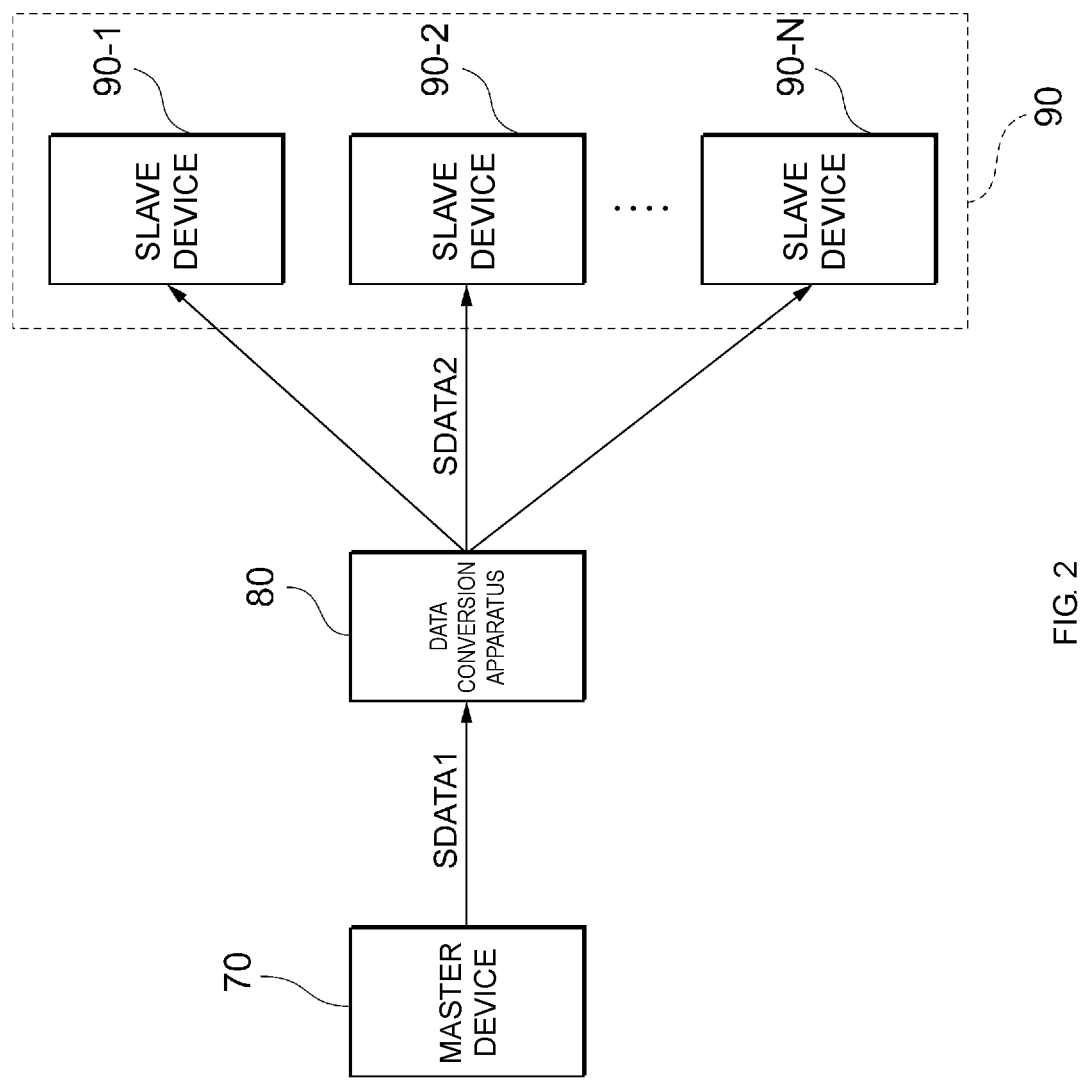
FIG. 2 is a diagram illustrating master-slave communication of the related art.

FIG. 1 is a circuit diagram of a data conversion apparatus 10 according to an embodiment of the present disclosure. The data conversion apparatus 10 converts serial binary data SDATA1 to which one parity bit P1 is added into serial binary data SDATA2 to which one parity bit P2 is added. The data conversion apparatus 10 includes multiplexers 20 and 30, a NOT gate 21, a comparator 40, and parity calculators 50 and 60. The multiplexer 20 selects and outputs, for each bit, any one of the bit values input to inputs I0, I1, I2, and I3 in accordance with a selection control signal S1. The input I0 receives non-inverted bit values of the serial binary data SDATA1 and the parity bit P1. The input I1 receives inverted bit values of the serial binary data SDATA1 and the parity bit P1 through the NOT gate 21. The input I2 receives a bit value of "0". The input I3 receives a bit value of "1".

The multiplexer 30 selects either of two selection control signals S2 and S3 in accordance with a selection control signal S4 and outputs the selected selection control signal as the selection control signal S1. To perform a conversion process on the serial binary data SDATA1 to obtain the serial binary data SDATA2, the selection control signal S4 instructs the multiplexer 30 to select the selection control signal S2 and output the selection control signal S2 as the selection control signal S1. Thus, the selection control signal S1 is identical to the selection control signal S2. The selection control signal S2 instructs the multiplexer 20 to select any one of the inputs I0, I1, I2, and I3 and output the corresponding bit value in accordance with a predetermined conversion rule. Thus, the multiplexer 20 functions as a converter that performs a conversion process on each bit value of the serial binary data SDATA1 in accordance with a predetermined conversion rule. The conversion process is a process for inverting or non-inverting each bit value of the serial binary data SDATA1 or converting each bit value of the serial binary data SDATA1 into "0" or "1". The multiplexer 20 performs this conversion process on the serial binary data SDATA1 sequentially, starting from the start bit, without necessarily buffering the serial binary data SDATA1. An example process for conversion from the serial binary data SDATA1 to the serial binary data SDATA2 includes, for example, but not limited to, converting an address included in the serial binary data SDATA1.

The parity calculator 50 calculates one parity bit PB1 for the serial binary data SDATA1 to be subjected to a conversion process. The parity bit PB1 calculated by the parity calculator 50 is referred to as a first parity bit PB1, for convenience of description. The parity calculator 60 calculates one parity bit PB2 for the serial binary data SDATA2 obtained as a result of the conversion process. The parity bit PB2 calculated by the parity calculator 60 is referred to as a second parity bit PB2, for convenience of description. In addition, the parity calculator 50 is referred to as a first parity calculator and the parity calculator 60 is referred to as a second parity calculator if the parity calculators 50 and 60 are distinguished from each other.

The comparator 40 compares the first parity bit PB1 with the second parity bit PB2 and outputs the selection control signal S3 to instruct the multiplexer 20 to convert the parity bit P1 into the parity bit P2 in accordance with whether the first parity bit PB1 and the second parity bit PB2 match. For conversion from the parity bit P1 to the parity bit P2, the selection control signal S4 instructs the multiplexer 30 to select the selection control signal S3 and output the selection control signal S3 as the selection control signal S1. Thus, the selection control signal S1 is identical to the selection control signal S3. When the first parity bit PB1 and the second parity bit PB2 match, the selection control signal S3 instructs the multiplexer 20 to output a parity bit obtained by non-inverting the parity bit P1 (i.e., the bit value input to the input I0) as the parity bit P2. When the first parity bit PB1 and the second parity bit PB2 do not match, the selection control signal S3 instructs the multiplexer 20 to output a parity bit obtained by inverting the parity bit P1 (i.e., the bit value input to the input I1) as the parity bit P2. This enables the parity bit P2 of the serial binary data SDATA2 obtained as a result of the conversion process to correctly reflect an erroneous bit value in the serial binary data SDATA1 to be subjected to the conversion process. The parity bits P1 and P2 are not limited to those for odd parity but may be those for even parity.

Accordingly, the data conversion apparatus 10 according to this embodiment enables the parity bit P2 of the serial binary data SDATA2 obtained as a result of a conversion process to correctly reflect an erroneous bit value in the parity bit P1 or in the serial binary data SDATA1 to be subjected to the conversion process. The generation of a parity bit in the way described above is effective for the data conversion apparatus 10, which is configured to perform a conversion process on the serial binary data SDATA1 sequentially, starting from the start bit, without necessarily buffering the serial binary data SDATA1.

The embodiment described above is intended to help easily understand the present disclosure, and is not to be used to construe the present disclosure in a limiting fashion. Various modifications or improvements can be made to the present disclosure without necessarily departing from the gist of the present disclosure, and equivalents thereof are also included in the present disclosure. That is, the embodiment may be appropriately modified in design by those skilled in the art, and such modifications also fall within the scope of the present disclosure so long as the modifications include the features of the present disclosure. For example, the elements included in the embodiment described above and the arrangement, materials, conditions, shapes, sizes, and the like thereof are not limited to those described in the illustrated examples but can be modified as appropriate. Furthermore, the elements included in the embodiment described above can be combined as much as technically possible, and such combinations of elements also fall within the scope of the present disclosure so long as the combinations of elements include the features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A data conversion apparatus comprising:
    a converter configured to convert one or more bit values of first serial binary data and a parity bit P1 added to the first serial binary data, in accordance with a predetermined conversion rule into corresponding one or more bit values of second serial binary data and a parity bit P2 added to the second serial binary data, the conversion including, for each of the one or more bit values of the first serial binary data, selectively:
        inverting the bit value,
        non-inverting the bit value,
        converting the bit value into 0, or
        converting the bit value into 1;
    a first parity calculator configured to calculate a first parity bit PB1 for the first serial binary data; and
    a second parity calculator configured to calculate a second parity bit PB2 for the second serial binary data,
    wherein:
    when the first parity bit PB1 and the second parity bit PB2 match, the converter is configured to output the parity bit P2 by non-inverting the parity bit P1, and
    when the first parity bit PB1 and the second parity PB2 bit do not match, the converter is configured to output the parity bit P2 by inverting the parity bit P1.

2. The data conversion apparatus according to claim 1, wherein the converter is configured to convert the first serial binary data sequentially, starting from a start bit of the serial binary data.

3. The data conversion apparatus according to claim 2, wherein the converter is configured to convert the first serial binary data without buffering the first serial binary data.

4. The data conversion apparatus according to claim 1, further comprising a comparator configured to compare the calculated first parity bit PB1 and the calculated second parity bit PB2.

5. The data conversion apparatus according to claim 4, further comprising:
    a multiplexer configured to receive an output of the comparator and output a control signal to the converter, wherein the converter selectively converts each of the one or more bit values of the first serial binary data based on the control signal.

6. The data conversion apparatus according to claim 1, wherein the converter is a multiplexer configured to receive, as inputs, the first serial binary data, an inverted form of the first serial binary data, a bit value of 1, and a bit value of 0.

7. The data conversion apparatus according to claim 6, further comprising a NOT gate that is input with the first serial binary data and outputs the inverted form of the first serial binary data to the converter.

8. The data conversion apparatus according to claim 1, wherein the first serial binary data is input to the first parity calculator and the second serial binary data is input to the second parity calculator.

9. The data conversion apparatus according to claim 1, wherein an input to the converter is connected to an input of the first parity calculator and an output of the converter is connected to an input of the second parity calculator.

* * * * *

UNITED STATES PATENT AND TRADEMARK OFFICE
CERTIFICATE OF CORRECTION

PATENT NO. : 10,566,998 B2
APPLICATION NO. : 15/944923
DATED : February 18, 2020
INVENTOR(S) : Yuji Shintomi It is certified that error appears in the above-identified patent and that said Letters Patent is hereby corrected as shown below:

In the Specification

Column 1, Line 48, "number of is is odd" should read -- number of 1s is odd --

Column 1, Line 51, "number of is in serial" should read -- number of 1s in serial --

Signed and Sealed this
Seventeenth Day of November, 2020

Andrei Iancu
*Director of the United States Patent and Trademark Office*